United States Patent
Dean et al.

(10) Patent No.: US 8,244,508 B1
(45) Date of Patent: Aug. 14, 2012

(54) METHOD FOR MODIFYING A PIECE OF 3D GEOMETRY

(75) Inventors: Daniel Dean, Acton, MA (US); Laurent Alt, Conflans Sainte-Honorine (FR)

(73) Assignee: SpaceClaim Corporation, Concord, MA (US)

( * ) Notice: Subject to any disclaimer, the term of this patent is extended or adjusted under 35 U.S.C. 154(b) by 439 days.

(21) Appl. No.: 12/553,632

(22) Filed: Sep. 3, 2009

Related U.S. Application Data

(60) Provisional application No. 61/100,457, filed on Sep. 26, 2008.

(51) Int. Cl.
*G06G 7/48* (2006.01)
(52) U.S. Cl. ............................................ 703/7; 700/98
(58) Field of Classification Search .................. 703/1, 6, 703/7; 345/419, 423, 427; 704/1; 700/98; 715/850
See application file for complete search history.

(56) References Cited

U.S. PATENT DOCUMENTS

| | | | |
|---|---|---|---|
| 6,219,055 B1 * | 4/2001 | Bhargava et al. | 715/850 |
| 6,810,295 B1 * | 10/2004 | Hochenauer et al. | 700/98 |
| 6,985,835 B1 * | 1/2006 | Etzion et al. | 703/1 |
| 7,099,803 B1 * | 8/2006 | Rappoport et al. | 703/1 |
| 2001/0043209 A1 | 11/2001 | Nagakura | |
| 2002/0107673 A1 * | 8/2002 | Haller et al. | 703/1 |
| 2003/0201992 A1 | 10/2003 | Wang et al. | |
| 2003/0210242 A1 | 11/2003 | Kripac | |
| 2005/0038642 A1 * | 2/2005 | Rameau et al. | 704/1 |
| 2006/0129259 A1 * | 6/2006 | Tornquist et al. | 700/98 |
| 2007/0027665 A1 * | 2/2007 | Maille et al. | 703/6 |
| 2007/0159480 A1 * | 7/2007 | Delarue et al. | 345/427 |
| 2008/0084414 A1 * | 4/2008 | Rosel et al. | 345/423 |
| 2008/0255809 A1 * | 10/2008 | Ran et al. | 703/1 |
| 2008/0316204 A1 * | 12/2008 | Deslandes | 345/419 |

OTHER PUBLICATIONS

Corney, et al., "3D Modeling with ACIS," Saxe-Coburg Publications, Stirling, UK, 2001, 419 pages.

\* cited by examiner

*Primary Examiner* — Kandasamy Thangavelu
(74) *Attorney, Agent, or Firm* — Wilmer Cutler Pickering Hale and Dorr LLP

(57) ABSTRACT

A three-dimensional solid geometry modeling method is described that can move or modify any piece of solid or surface geometry, such as a protrusion or depression, when faces are changed in a way that is not obvious or predictable from the original data. The method involves a combination of local changes and a context-based process that uses simplification, detaching, modification, and reattaching algorithms. The method is invoked automatically when a modeling tool (such as Move or Pull) is used to move or modify a piece of geometry. During the movement or modification, the geometry reflects the changes dynamically as the user interacts with the modeling tool. When performing the modification, simplification of the faces and edges can be manually or automatically invoked.

20 Claims, 6 Drawing Sheets

METHOD FOR MODIFYING A PIECE OF 3D GEOMETRY

CROSS-REFERENCE TO RELATED APPLICATIONS

This application claims the benefit under 35 U.S.C. 119(e) of U.S. Provisional Patent Application No. 61/100,457, filed on Sep. 26, 2008, entitled "METHOD FOR MODIFYING A PIECE OF 3D GEOMETRY", which is hereby incorporated by reference herein in its entirety.

BACKGROUND OF THE INVENTION

1. Field of the Invention

This invention relates to modifying a piece (i.e., a set of faces) of 3D geometry when the number of faces and/or edge definitions comprising the piece change. This modification is called a non-local change.

2. Prior Art

Objects in a CAD system can be represented in a parameter-based way or in a geometry-based way. In a parameter-based representation, the object is modeled as an object along with a set of features and history that define the object. In a geometry-based representation, the object is simply represented as a set of geometric data.

Modification of geometry without knowledge of its construction history requires specific methods. Geometry engines, such as ACIS or Parasolid, provide the methods to modify local geometry by moving or modifying a set of faces within a part. However, these methods are limited in the types of change they can support. They can support "local operations," which are changes in which the shape (or topology) of the modified piece of geometry is very similar to the original shape. Specifically, the piece of geometry has the same number of faces and similar edge definitions. These methods cannot support changes where faces are changed in a way that is not obvious or predictable from the original data. They often fail in cases where new edges appear or disappear during the modification process. Commonly, faces and edges are deleted, added, split, or merged into others, and tracking these changes makes many systems highly unstable.

Parameter-based CAD systems offer the ability to move or modify a piece of geometry through the blind modification of feature parameters. This means that edges and faces are continually recalculated and recreated as the new "recipe" for feature re-generation is followed and geometry is remade. The downstream effects of these changes are unpredictable, since an edge or face needed for a later operation could be missing, changed, or swapped for another as a result of recomputation. Conversely, those systems that use geometry-based representations offer the ability to move or modify a piece of geometry (such as a protrusion or depression) fail when the movement or modification results in an unpredictable or non-obvious change (such as a change in the number of faces or when new edges appear or disappear). Small, local changes are therefore provided for, but larger topological changes are precluded. For example, most CAD systems simply prevent the user from moving a protrusion halfway into a solid, since the intersection will result in a greater or fewer number of faces, and therefore the local operation fails.

SUMMARY

A three-dimensional solid geometry modeling method is described that can move or modify any piece of solid or surface geometry, such as a protrusion or depression, when faces are changed in a way that is not obvious or predictable from the original data. The method involves a combination of local changes and a context-based process that uses simplification, detaching, modification, and reattaching algorithms. The method is invoked automatically when a modeling tool (such as Move or Pull) is used to move or modify a piece of geometry via a simple mouse drag operation and the movement or modification results in a change that is not obvious or predicable from the original data (such as when the number of faces or edge definitions change). The method also handles any round, fillet, or chamfered faces attached to the piece of geometry being modified. For example, when a piece of geometry is moved to a location where it intersects another piece of geometry, faces are removed and edges are redefined as the piece of geometry joins the intersecting piece. Then the necessary rounds, fillets, or chamfers need to be reapplied to join the moved feature to the intersecting piece of geometry. During the movement or modification, the geometry reflects the changes dynamically as the user interacts with the modeling tool. When performing the modification, simplification of the faces and edges can be manually or automatically invoked.

Embodiments of the invention include methods and system for modifying a piece of 3D geometry when the number of faces and/or edge definitions comprising the piece change. More specifically, embodiments of the invention include a method of interactively modifying a feature of interest attached to a CAD object when it is moved relative to the CAD object, such that the feature of interest can be maintained and adapted to geometry changes during non-local movements. The method includes a feature of interest attached to a first boundary representation CAD object within a three dimensional modeling space, wherein the feature of interest forms at least part of an intersection between the first boundary representation CAD object and the second boundary representation CAD. The method also includes receiving a command from a user to reposition the feature of interest relative to the first boundary representation CAD object, and determining an updated position of the feature of interest. The method also includes generating, in real-time, an updated feature of interest based on the updated position of the feature of interest relative to the first CAD object, wherein the feature of interest is modified in response to the updated position, such that the feature of interest continues forming at least part of the intersection between the first boundary representation CAD object and the second boundary representation CAD object, and wherein the feature of interest has a different number of faces and edges. The method also includes redisplaying the first boundary CAD object and modified feature of interest within the three dimensional modeling space for further real-time interactive modifications by the user.

Embodiments of the invention also include wherein the feature of interesting is attached to the first CAD object with an attachment detail, and wherein the attachment detail is at least one of a fillet, a round, and a chamfer. Embodiments of the invention also include calculating an updated feature of interest, by gathering a plurality of neighboring faces of the feature of interest into a group; comparing, using a tolerance, the group of neighboring faces with a planar face; and replacing the group of neighboring faces with the planar face when the tolerance is met. Embodiments of the invention also include calculating an updated feature of interest by pointwise sampling each of the neighboring faces in the group and comparing each face to an analytic surface; and converting at least one face from the group of neighboring faces to an analytic surface. Embodiments of the invention also include simplifying the feature of interest.

DETAILED DESCRIPTION

Embodiments of the invention allow any set of faces (referred to hereafter as a "feature of interest") of a solid or surface to be moved or modified when that modification causes the number of faces and/or edge definitions that comprise the feature of interest to change. Features of interest can be moved or modified regardless if they were originally created in the embodiment's CAD system or if they were imported from another CAD system.

In one embodiment, the invention is an automatic method within a three-dimensional modeling system, namely the Detach First method. The Detach First method is applied automatically when the user moves or modifies the feature of interest with the Move or Pull tools. The user applies the Move or Pull tool to the selected feature, and the faces, edges, and any attached rounds, fillets, or chamfers are automatically modified as the feature is moved into or out of intersection with other geometry. (The Detach First method does not imply any particular direction, it works for any user-specified direction or rotation.) These modifications can be made without the need to completely rebuild the object or deal with various constraints of the modeled object. The term "object" refers to any geometric solid or surface represented within the CAD system. Solid objects are composed of a set of faces that enclose a volume. The terms "round," "fillet," and "chamfer" refer to attached, cosmetic faces that do not affect the basic underlying object.

When moving objects within the CAD system, the Detach First method takes user-selected faces as inputs, and delivers the results of the move or modification in 3D as an output. The objects output by movements or modifications that use the Detach First method can be edited like any other solid or surface geometry.

Figure 4:
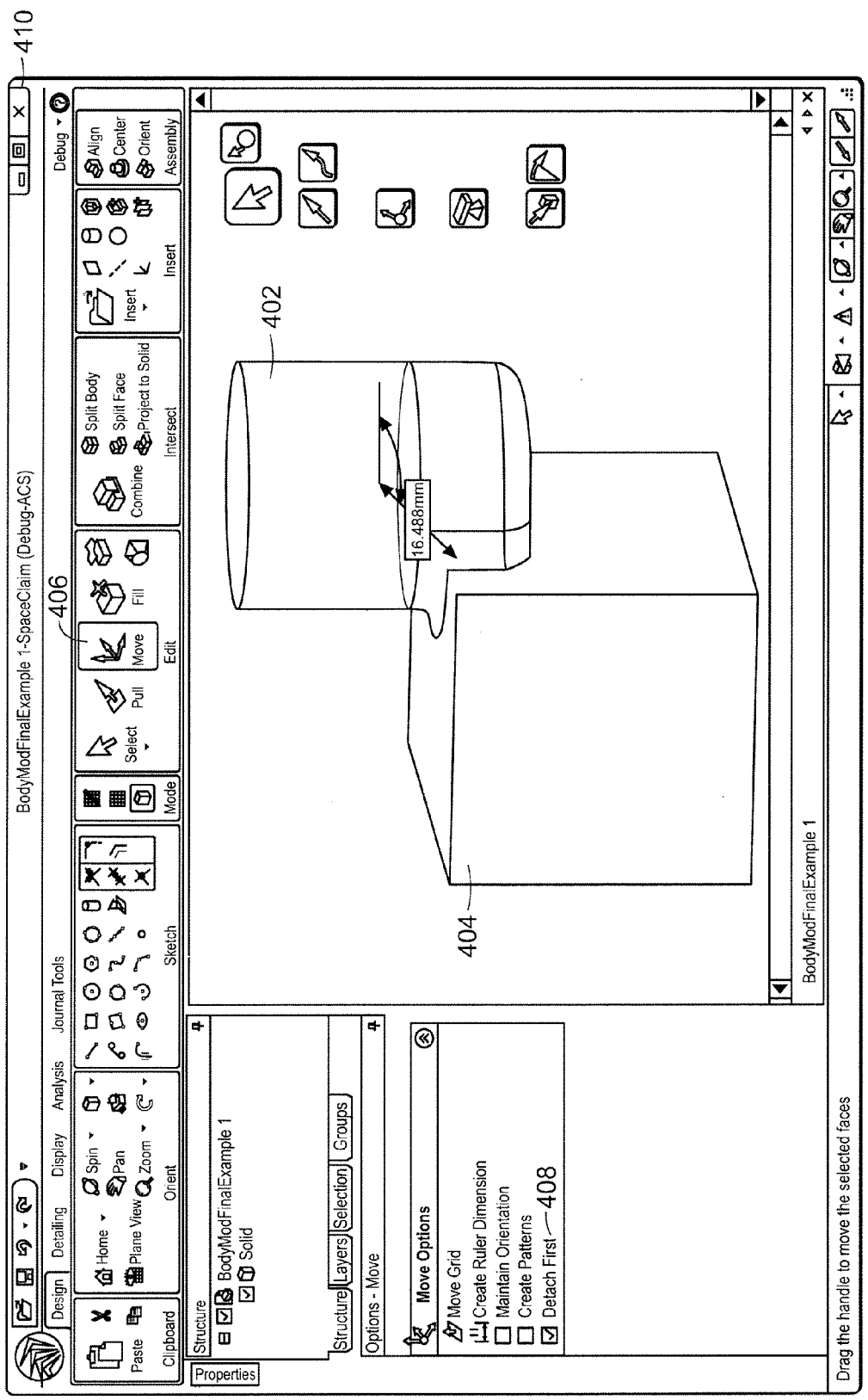
FIG. 4 shows a three-dimensional modeling software application containing the tools that use the Detach First method and displaying a selected feature of interest.
Figure 5:
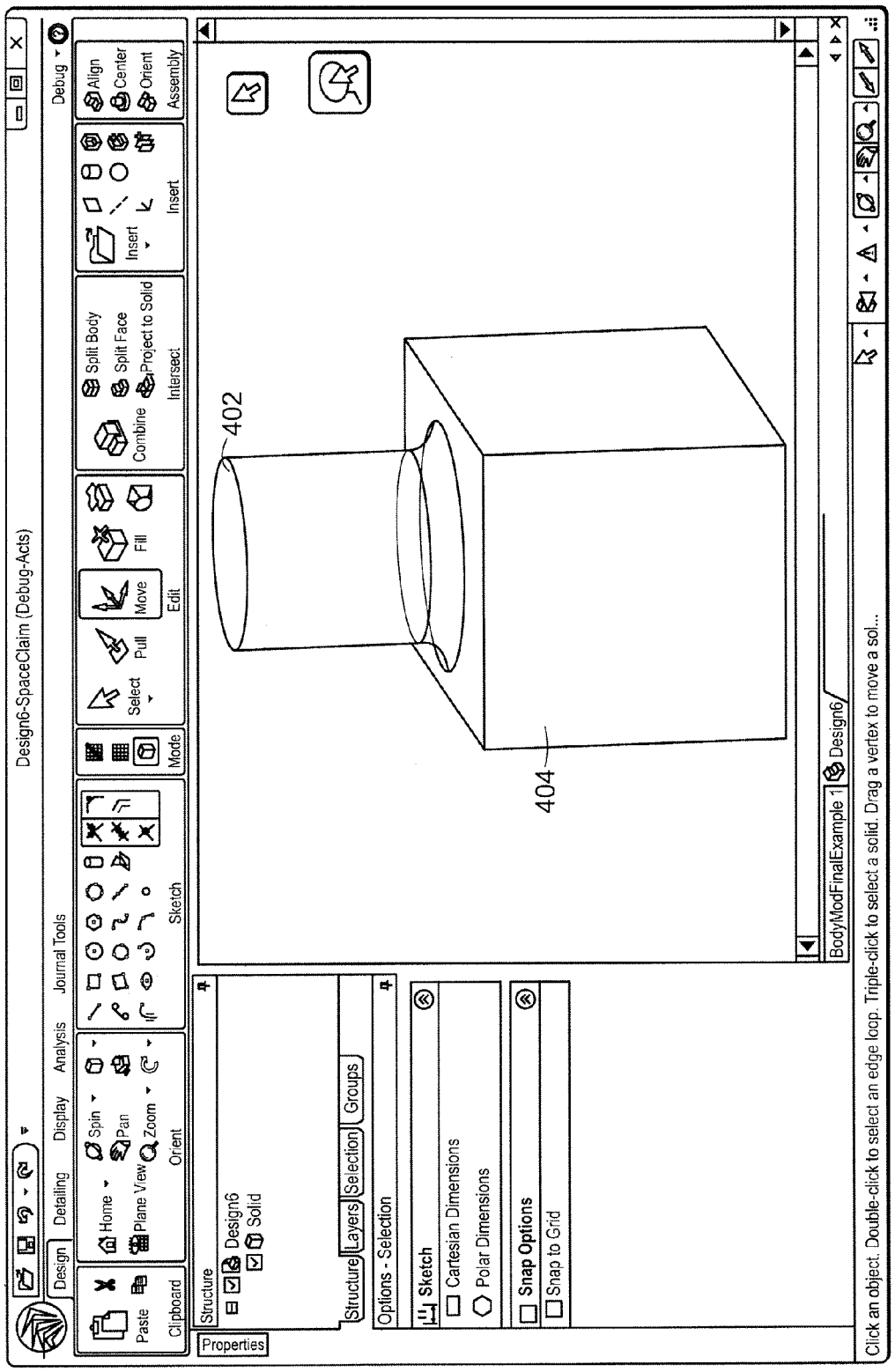
FIG. 5 shows the user moving the feature of interest using the Detach First method.

This method of transforming 3D features of interest with or without attached rounds, fillets, and/or chamfers when they intersect with other objects is possible because the modeling system does not maintain a level of history information on top of the geometry information that would make detachment or reattachment operations incompatible with the history information. Therefore, these geometry changes can be shown immediately, without replicating all the historical steps. The moment a user selects the feature to be edited and moves or modifies the feature with the Move or Pull tools, the program regenerates the object. The resulting simplicity of the user interaction provided by this method is shown by FIGS. 4 and 5, which show a user moving a feature of interest to another location that intersects the object in a different way (and that requires a non-obvious, unpredictable change—from three faces and five rounds to two faces and one round). All edits are performed using the Move or Pull tools, or an alternative method (e.g., keyboard combined with mouse clicks).

Figure 1:
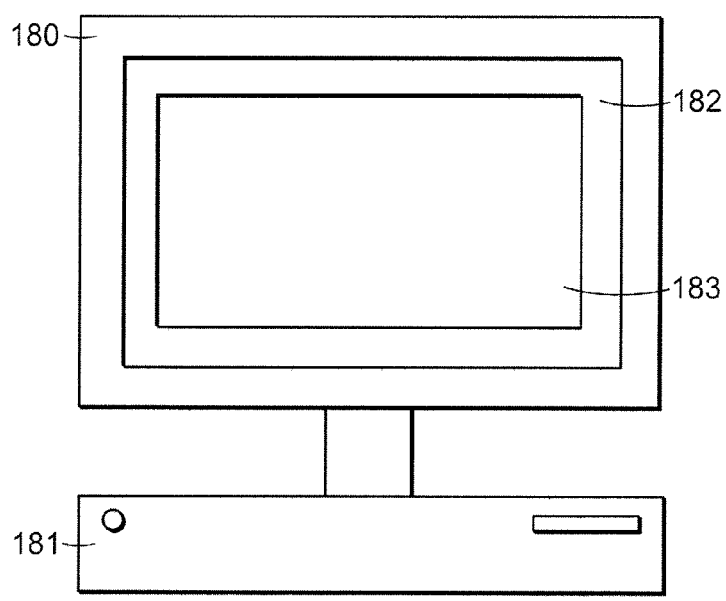
FIG. 1 shows a computer system on which the method in accordance with embodiments of the invention can be implemented.

FIG. 1 shows a computer system capable of implementing embodiments of the invention. Further details of the overall system are given in the related applications entitled "Method for Modifying Any Modeled Surface As A Lofted Surface," filed Nov. 9, 2007, and with Ser. No. 11/937,926; "Systems and Methods for Using a Single Tool for the Creation and Modification of Solids and Surfaces," filed Jan. 9, 2008, and with Ser. No. 61/020,076; and "Method for Modifying 3D Geometry Using any Cross-Section Plane," filed Jan. 9, 2008, and with Ser. No. 11/971,756 which are herein incorporated by reference in their entirety.

The system includes a computer 181 containing memory and a processor running a standard operating system 182. Running within the operating system 182 with a graphical user interface is a user-level application 183, such as a modeling system that includes a Detach First method in accordance with embodiments of the invention. The operating system and the modeling system are displayed on the monitor 180.

Computer 181 can also have a network interface card and be connected to other computers, servers, and/or storage service. To interface with modeling system 183, a mouse and keyboard (not shown) or other input device can be used. One example of a computer system capable of running the Detach First method is a computer system running Microsoft Windows XP with Service Pack 2 or Windows Vista operating systems. The computer system has a video card, such as those provided by Radeon, NVIDIA, or AMD, with Full DirectX 9c hardware support and 64 MB or more of graphics memory, Pixel shader 2.0 hardware support, 32 bits/pixel, and 1024× 768 minimum resolution. The computer system can have a Pentium 4 2.0 GHz or Athlon 2000+ or faster processor, a 32-bit (x86) or 64-bit (x64) processor. The computer system can have at least 512 MB of RAM. The system can also have 2 GB of available disk space, a CD/DVD drive, Microsoft Internet Explorer 5.5 or higher, and a 2 button+wheel mouse.

Figure 2:
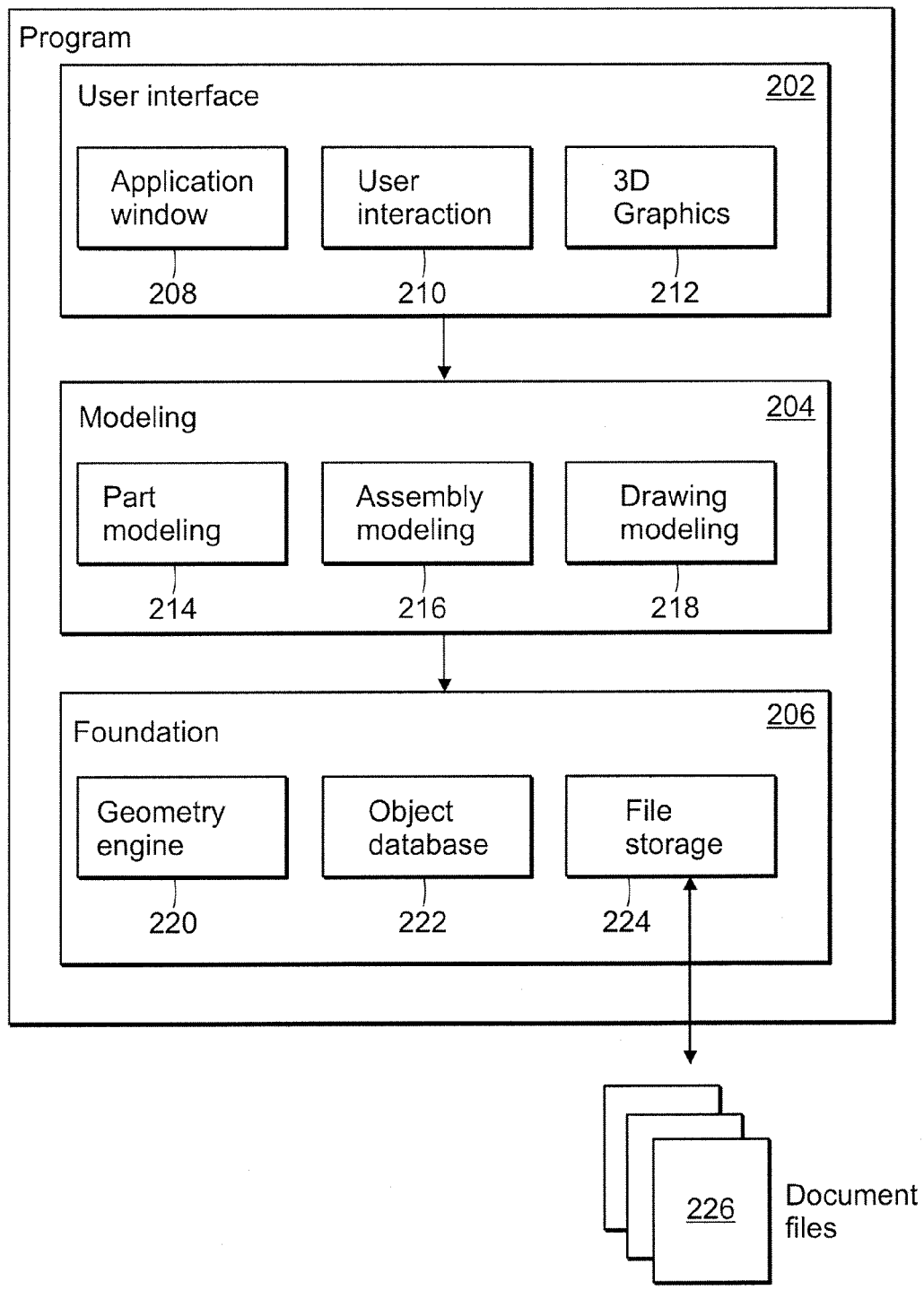
FIG. 2 shows the overall architecture of the modeling system containing the Detach First method.

FIG. 2 is an overall architecture diagram of the structure of the modeling system containing the Detach First method in accordance with embodiments of the invention.

The modeling system 183 is made up of a user interface layer 202, a modeling layer 204, and a foundation layer 206. The user interface layer interacts with the user, the modeling layer embodies logic associated with the Pull and Move tools and other tools of the modeling system, and the foundation layer provides geometry modeling and other file services.

The user interface layer 202 includes an application window 208, which contains the various tools (Move, Pull, Detach, Combine) and other interface components common to modeling tools that allow a user to interact with the modeling system. It also contains the standard window manipulation features.

User interaction component 210 includes the Move, Pull, Detach, and Combine tools and other standard tools for selecting objects, viewing objects in different ways, or obtaining information about objects. Essentially, the user interface layer provides a way for the user to work with the geometry model and the geometry engine, the output of which is displayed on the monitor 180 using a 3D graphics engine 212. 3D graphics engine 212 renders geometry models to the application window 208 for interaction and manipulation by the user. This functionality can be provided by DirectX.

The modeling layer 204 provides the logic and algorithms that underlie the commands and tools in the user interface. It communicates with the geometry engine 220 based on user actions to display the geometry created by the user actions. The geometry engine is a known component capable of performing calculations on objects. One geometry engine compatible with embodiments of the invention is the ACIS geometry engine from Spatial Corporation, although other geometry engines with similar capabilities may also be used. Further details of the ACIS geometry engine are provided in Corney, J and Lim, T, 3D Modeling with ACIS, Stirling, UK, which is hereby incorporated by reference in its entirety.

The modeling layer is made up of part modeling component 214, assembly modeling component 216, and drawing modeling component 218. The part modeling component 214 manages CAD objects and houses creation and manipulation algorithms in the area of 3D solids and 2D sections and sketches.

The assembly modeling component 216 manages CAD objects and algorithms for assembly component instantiation and placement, mating conditions, and the ability to do part modeling in the context of an assembly. Assemblies are user-created collections of parts.

The drawing modeling component 218 manages CAD objects and algorithms for creating multi-sheet drawings, drawing views, and drawing annotations. Drawings are 2D representations of 3D objects meant to be printed on paper in standard engineering sizes and formats.

The foundation layer 206 provides a software platform used to support higher-level layers of the application. The geometry engine 220 supports the creation and modification of geometry and topology, and provides algorithms for solid modeling and geometric solving. The object database component 222 manages the temporary, in-memory representation of CAD objects, providing a unified framework for inter-object references, undo actions, and associative updates. The file storage component 224 provides persistent storage of CAD objects within document files 226, along with inter-document relationships, such as assembly-component relationships or drawing-format relationships.

Figure 3:
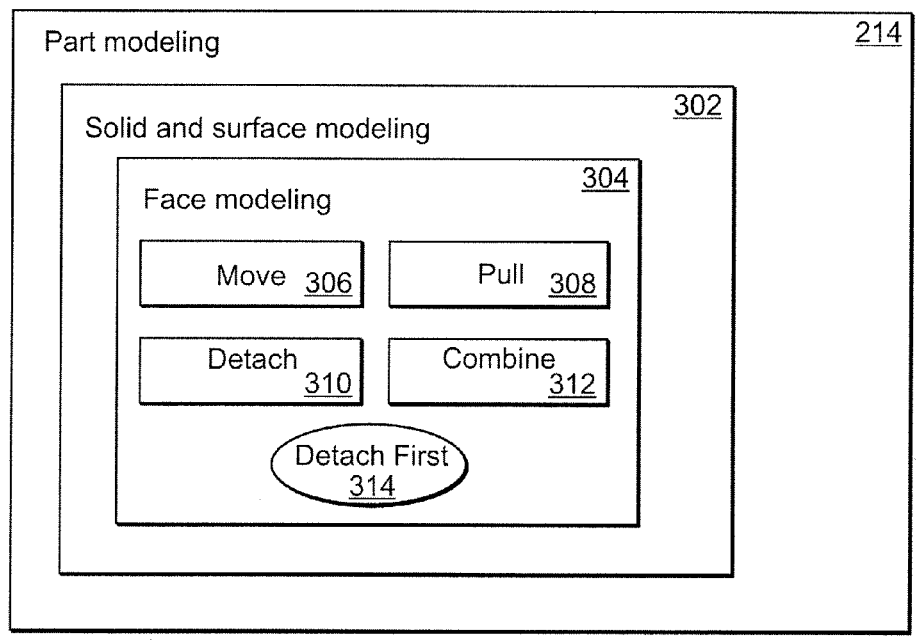
FIG. 3 shows the detailed architecture of the components that contain the Detach First method.

FIG. 3 shows the hierarchy of object modeling components in accordance with the design of the Detach First method.

In the CAD program, multiple solids and surfaces are modeled in the part modeling component 214 which has the necessary algorithms for management and manipulation of 3D solids and surfaces, as well as 2D sections and sketches.

Within the part modeling component 214 is the solid and surface modeling component 302, which is responsible for the management and manipulation of solid objects and surfaces. Unlike parametric, feature-based CAD systems, which make up the majority of the current systems, embodiments of the invention work directly in real time on the solid and surface geometry in the face modeling component 304, as opposed to forcing the user to set up each individual object in a particular feature and then requiring a calculation at the end of the operation. The Pull, Move, Detach, and Combine components 306-312 are subsets of the face modeling component and share the Detach First algorithms 314, the embodiments of the invention, for allowing any feature of interest to be moved or modified that is not obvious or predictable from the original data.

User interaction with the Detach First method will now be described with respect to FIGS. 4 and 5. FIGS. 4 and 5 show a user moving a protruding feature of interest to another location that intersects the object in a different way (and that requires a non-obvious, unpredictable change—from three faces and five rounds to two faces and one round).

FIG. 4 shows a user about to move a selected feature of interest 402 over the object 404 with the Move tool 406 and the Move tool's Detach First option 408 selected.

The Detach First option can be accessed through many methods, including the use of a checkbox 408 within the application window 410 of the overall CAD system. Alternatively, the keyboard could be used to select the Detach First option method.

FIG. 5 shows the feature of interest 402 at its new location on the object 404.

As the user drags the mouse, the geometry is recalculated and redrawn repeatedly, so that the solid appears to be modified in real-time.

The Detach First method can be used to move or modify a newly created object, an existing object, or an object from another CAD system; if it is from another CAD system, the modeling system uses the foundation layer's geometry engine 220 to convert the imported data from the originating application into a geometry-only format.

The conversion strips all history and feature data, so that the source of the geometry data has no influence. The geometry engine also performs all conversion, checking, and geometry calculation functions. On import, the CAD system retrieves only the final definition of the geometry, and places it into the object database 222. The CAD system creates a new, persistent file with the file storage component 224. If the geometry was imported from another system, the history and parameters used to create the final geometry in that software are ignored.

The import and translation of outside geometry can be performed by the geometry engine through its built-in translators. After importing outside geometry, the geometry-only data is provided to higher-level layers of the system. Although history information and other data from parametric systems has been removed, the geometry still retains information about primitives and relations between objects in the imported geometry.

Figure 6:
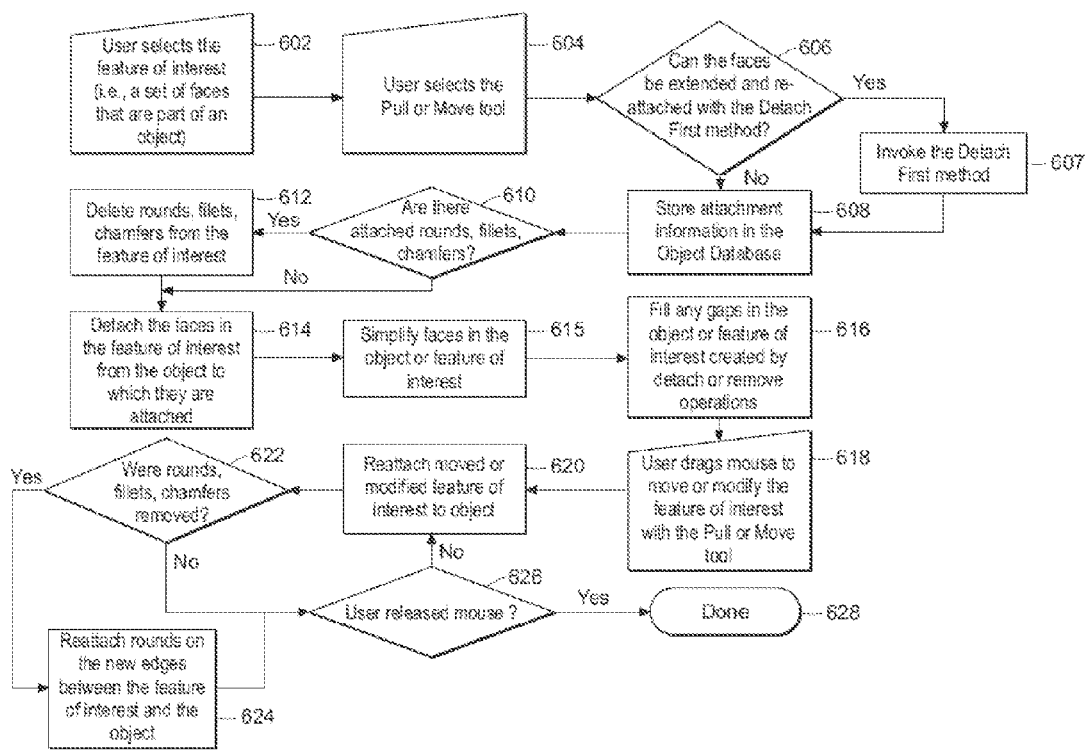
FIG. 6 describes an overview of the back-end logic for implementation of the Detach First method within the Move and Pull tools.

The logic of the Detach First method will now be described with respect to FIG. 6. FIG. 6 shows an overview of the workflow and logic that implements the moving or modification of a feature of interest with the Move or Pull tools. The Pull tool is a primary method for offsetting faces, and the Move tool is a primary method for translating and rotating faces. Specifically, FIG. 6 shows how a user can move or modify a feature of interest using the Move or Pull tools when the faces that comprise the feature are changed in a way that is not obvious or predictable from the original data. It shows the logic used by the Detach First method in this case. The user selects the feature of interest, then selects the Move or Pull tool. The Move or Pull tool checks to see whether the faces of the feature of interest can be extended and reattached using the Detach First method. If so, the tool calls the Detach First method. The method stores neighboring attachment information, detaches the feature of interest, removes and stores any rounds, fillets, or chamfer faces, fills any gaps created in the object, then reattaches the moved (and possibly modified) feature of interest. Rounds, fillets, and chamfers are then reattached to the new edges between the feature of interest and the object. The method is called continually for each mouse movement made with the Move and Pull tools, which makes the feature of interest appear to be attached and moving or changing seamlessly during the entire user operation.

At step 602, the user selects the set of faces that are part of an object, such as a protrusion, depression, or a mix of protrusions and depressions (for example, a depression such as a hole embedded in a protrusion). These set of faces become the "feature of interest." At step 604, the user selects the Pull or Move tool. At step 606, the Pull or Move tool determines whether the Detach First method can be invoked by checking to see whether the faces of the feature of interest can be extended and reattached. It does this by checking the feature of interest against a set of cases which the Detach First method can handle.

To determine if the Detach First method can be invoked, the method first determines if the feature of interest can be detached from an object. Then, when the feature of interest is detached from the object, at least two open loops of surfaces are generated. This includes the feature of interest's surface bottom and one or more other faces of the feature of interest. The method then determines if the feature of interest's open loop (e.g., the bottom of a cylinder) can be extended. The method then tests if the extension intersects any part of the rest of the surfaces of the object or the feature of interest. The method then determines if any face of the rest of the surfaces can be extended to hold the extended faces of the feature of interest, thereby allowing the open loop to be closed.

When the Detach First method is invoked at step 607, then at step 608, the Detach First method stores the attachment information in the Object Database 222 (shown in FIG. 2) within the database's attachmentLaminarLoops data variable.

At step 610, the Detach First method checks each object that connects the feature of interest with the object for logical information indicating attached rounds, fillets, and chamfers. To do this, the method calls the geometry engine's (220) Fillet3DHelper.CollectAdjacentFillets function, passing it each of the faces in the feature of interest. The Fillet3DHelper.CollectAdjacentFillets function returns all the fillets, rounds, and chamfers attached to the feature of interest. The Detach First method also updates an internal variable to indicate whether rounds, fillets, and chamfers were attached. At step 612, the Detach First method removes these objects from the feature of interest by calling the geometry engine's (220) RemoveAdjacentFillets function, passing it the faces in the feature of interest and storing the result in the Object Database.

At step 614, the Detach First method detaches the selected feature of interest from the object to which it is attached. For example, if the feature of interest is a protrusion or depression, the method does this by calling the geometry engine's (220) PrepareForTransformProtrusion or PrepareForTransformDepression function, passing it the faces in the feature of interest to determine whether the face is attached to the object. If the face is attached, the method calls the geometry engine's (220) Detach function to detach the face from the object.

At step 615, the method simplifies the object and the feature of interest by first identifying those faces of each entity that can be replaced either by simpler ones, or merged together into one. The method first gathers neighboring faces into groups, which may contain only one face, by querying the object database (222) for each face (the neighbors of each face are a property of the face). The method then calls the geometry engine's (220) TryReplaceFacesWithCommonPlane function to replace, within a tolerance, each group of faces by one planar face. If this function fails, the method calls the geometry engine's (220) TryReplaceFacesWithCommonCylinder function to replace, within a tolerance, this group of faces by a cylindrical face. Similarly, the method tries to simplify the faces with conical, spherical, and lofted surfaces. Step 615 improves the chances of success of step 616.

One method for performing the simplification process using a tolerance is to first point-wise sample each face and compare it with a known set of 3D analytic surfaces (e.g. planes, cylinders, cones, spheres, torii). Once the faces are detected and converted (if necessary) to analytics, they are compared to each other, measured, and if close, moved and rotated in space until they are made co-planar or co-cylindrical, etc. For example, two surfaces on either side of a rib can be simplified to planes and then adjusted so that they are themselves co-planar. That way, when the rib is removed, the planes can be filled to form one continuous plane, with no kinks or gaps in it.

At step 616, the method fills any gaps in the object or feature created by steps 612 and 614. To do this, the method uses the geometry engine's (220) standard FillObject and FillFeature functions. The geometry engine's fill functions return the faces necessary to fill the gaps. The fill function can use information from how the feature of interest was earlier detached from the object. How the feature of interest was detached provides information about how the topology was connected together at Detach time. This information can be stored, so that when the method fills any gaps in the object or the feature of interest, the method can choose the correct path to result in the desired geometry (e.g., geometry that is similar to the original geometry).

At step 618, the user moves or modifies the selected feature of interest with the Pull or Move tools. With each change in mouse location, at step 620, the method reattaches the moved or modified and extended feature of interest to the object in its new location or in its new shape. The method reattaches the feature by first extending the moved or modified feature of interest by an appropriate amount. It does this by calling the geometry engine's (220) ExtendEdgesUpToBody function, passing it the edges that were attached to the object before the move or modify operation. Next, it calls the geometry engine's (220) IBody_Merge function, passing it the feature of interest and the object to determine where the new edges should be created. This function computes all the intersection loops between the extended feature of interest and the object, keeps those intersection loops that are images of the attachments between the starting feature of interest and the object, discards all the other intersection loops along with the faces they embed, and rebuilds a new object by connecting the remaining faces along the remaining intersection loops.

At step 622, the method checks its internal variable (updated in step 610) to see if rounds, fillets, or chamfers were removed. If the variable is True, then in step 624, the method queries the Object Database 222 (shown in FIG. 2) for the attachmentLaminarLoops data variable to return the rounds, fillets, and chamfers stored there in step 612. The method then passes each round, fillet, and chamfer along with the new edges on which these faces need to be reattached to the geometry engine's (220) Filled3DHelper.ReapplyFillets function. The fillet function returns the new solid or surface created by reattaching the feature of interest to the object.

Once the rounds, fillets, and chamfers are reattached, or if the internal variable updated in step 610 was False, the Detach First method checks to see if the move or pull action is complete at step 626. If the user continues to move or pull the feature of interest, steps 620-624 are repeated, making the feature of interest appear to move or be modified seamlessly as it remains attached to the object. If the user releases the mouse, the Detach First method returns control to the active tool (Move or Pull).

For example, in the case of the feature of interest being moved in FIGS. 4 and 5, at step 602, the user selects the feature of interest 402 (in FIG. 4). At step 604, the user selects the Move tool 406. Since the Detach First option 408 is selected, the faces are checked at step 606. Since these faces can be extended and reattached, the attachment information is stored in the Object Database at step 608. Next, at step 610, the method checks to see if there are attached rounds, fillets, and chamfers. Since there are rounds and fillets, they are deleted and stored at step 612. At step 614, the faces in the feature of interest 402 are detached from the object 404, and any gaps left in the object are filled at step 616. As the user drags the mouse to move the feature of interest to its new location, shown in FIG. 5, the feature of interest is reattached to the object at step 620, the rounds and fillets are reattached at step 624, and a check for the end of the movement is performed at step 626. Steps 620 through 626 are repeated until the user completes the movement at step 628.

The invention claimed is:

1. A method of interactively modifying a feature of interest attached to a CAD object when it is moved relative to the CAD object, such that the feature of interest is maintained and adapted to geometry changes during non-local movements, the method comprising:
    a feature of interest attached to a first boundary representation CAD object within a three dimensional modeling space, wherein the feature of interest forms at least part of an intersection between the first boundary representation CAD object and a second boundary representation CAD object;
    receiving a command from a user to reposition the feature of interest relative to the first boundary representation CAD object, and determining an updated position of the feature of interest;
    generating, in real-time, a modified feature of interest based on the updated position of the feature of interest relative to the first boundary representation CAD object, wherein the feature of interest is modified in response to the updated position, such that the modified feature of interest continues forming at least part of the intersection between the first boundary representation CAD object and the second boundary representation CAD object, and wherein the modified feature of interest has a different number of faces and edges; and
    redisplaying the first boundary representation CAD object and the modified feature of interest within the three dimensional modeling space for further real-time interactive modifications by the user.

2. The method of claim 1, wherein the modified feature of interest is attached to the first boundary representation CAD object with an attachment detail, and wherein the attachment detail is at least one of a fillet, a round, and a chamfer.

3. The method of claim 2, wherein the attachment detail is maintained throughout the intersection of the first boundary representation CAD object and the second boundary representation CAD object when the feature of interest is modified.

4. The method of claim 1, wherein generating a modified feature of interest comprises:
    gathering a plurality of neighboring faces of the feature of interest into a group;
    comparing, using a tolerance, the group of neighboring faces with a planar face; and
    replacing the group of neighboring faces with the planar face when the tolerance is met.

5. The method of claim 4, further comprising:
    point-wise sampling each of the neighboring faces in the group and comparing each face to an analytic surface; and
    converting at least one face from the group of neighboring faces to an analytic surface.

6. The method of claim 5, further comprising:
    at least one of moving and rotating a converted face to make it co-planar with a second converted face from the group of neighboring faces.

7. The method of claim 1, wherein generating a modified feature of interest based on the updated position of the feature of interest relative to the first boundary representation CAD object comprises:
    extending the feature of interest to generate an extended feature of interest;
    computing a plurality of intersection loops between the first boundary representation CAD object and the extended feature of interest;
    retaining, from the plurality of intersection loops, the intersection loops that are similar to the feature of interest; and
    modifying the feature of interest using the retained intersection loops.

8. The method of claim 1, further comprising:
    simplifying the feature of interest.

9. The method of claim 1, wherein generating the modified feature of interest is performed without recording history information.

10. The method of claim 1, further comprising:
    determining if it is possible to modify the feature of interest, and only receiving a command from a user to reposition the feature of interest relative to the first boundary representation CAD object when it is determined that it is possible to modify the feature of interest.

11. A system for interactively modifying a feature of interest attached to a CAD object when it is moved relative to the CAD object, such that the feature of interest is maintained and adapted to geometry changes during non-local movements, the method comprising:
    a feature of interest attached to a first boundary representation CAD object within a three dimensional modeling space, wherein the feature of interest forms at least part of an intersection between the first boundary representation CAD object and a second boundary representation CAD object;
    a graphical user interface receiving a command from a user to reposition the feature of interest relative to the first boundary representation CAD object, and determining an updated position of the feature of interest;
    a module generating, in real-time, a modified feature of interest based on the updated position of the feature of interest relative to the first boundary representation CAD object, wherein the feature of interest is modified in response to the updated position, such that the modified feature of interest continues forming at least part of the intersection between the first boundary representation CAD object and the second boundary representation CAD object, and wherein the modified feature of interest has a different number of faces and edges; and
    the graphical user interface redisplaying the first boundary representation CAD object and the modified feature of interest within the three dimensional modeling space for further real-time interactive modifications by the user.

12. The system of claim 11, wherein the modified feature of interest is attached to the first boundary representation CAD object with an attachment detail, and wherein the attachment detail is at least one of a fillet, a round, and a chamfer.

13. The system of claim 12, wherein the attachment detail is maintained throughout the intersection of the first boundary representation CAD object and the second boundary representation CAD object when the feature of interest is modified.

14. The system of claim 11, wherein the module generating a modified feature of interest comprises:
   gathering a plurality of neighboring faces of the feature of interest into a group;
   comparing, using a tolerance, the group of neighboring faces with a planar face; and
   replacing the group of neighboring faces with the planar face when the tolerance is met.

15. The system of claim 14, further comprising modules for:
   point-wise sampling each of the neighboring faces in the group and comparing each face to an analytic surface; and
   converting at least one face from the group of neighboring faces to an analytic surface.

16. The system of claim 15, further comprising modules for:
   at least one of moving and rotating a converted face to make it co-planar with a second converted face from the group of neighboring faces.

17. The system of claim 11,
   the module generating a modified feature of interest based on the updated position of the feature of interest relative to the first boundary representation CAD object comprises modules for:
      extending the feature of interest to generate an extended feature of interest;
      computing a plurality of intersection loops between the first boundary representation CAD object and the extended feature of interest;
      retaining, from the plurality of intersection loops, the intersection loops that are similar to the feature of interest; and
      modifying the feature of interest using the retained intersection loops.

18. The system of claim 11, further comprising modules for:
   simplifying the feature of interest.

19. The system of claim 11, wherein generating the modified feature of interest is performed without recording history information.

20. The system of claim 11, further comprising modules for:
   determining if it is possible to modify the feature of interest, and only receiving a command from a user to reposition the feature of interest relative to the first boundary representation CAD object when it is determined that it is possible to modify the feature of interest.

* * * * *